(12) United States Patent  (10) Patent No.: US 7,766,671 B2
Hattori  (45) Date of Patent: Aug. 3, 2010

(54) ELECTRONIC COMPONENT AND METHOD OF FORMING THE SAME

(75) Inventor: Atsuo Hattori, Iwata (JP)

(73) Assignee: Yamaha Corporation, Shizuoka, Ken (JP)

( * ) Notice: Subject to any disclaimer, the term of this patent is extended or adjusted under 35 U.S.C. 154(b) by 11 days.

(21) Appl. No.: 12/171,856

(22) Filed: Jul. 11, 2008

(65) Prior Publication Data
US 2009/0017670 A1    Jan. 15, 2009

(30) Foreign Application Priority Data
Jul. 12, 2007    (JP)    ............... 2007-183494

(51) Int. Cl.
*H01R 9/00*    (2006.01)
(52) U.S. Cl. ................. 439/74; 439/290; 439/291; 439/591
(58) Field of Classification Search ............. 439/74, 439/290, 291, 591
See application file for complete search history.

(56) References Cited

U.S. PATENT DOCUMENTS

| | | | | |
|---|---|---|---|---|
| 3,526,867 A | * | 9/1970 | Keeler | ............... 439/74 |
| 5,069,627 A | * | 12/1991 | Buck et al. | ............... 439/66 |
| 5,118,299 A | * | 6/1992 | Burns et al. | ............... 439/74 |
| 5,312,456 A | | 5/1994 | Reed et al. | |
| 5,774,341 A | * | 6/1998 | Urbish et al. | ............... 361/774 |
| 6,129,559 A | | 10/2000 | Hirata et al. | |

FOREIGN PATENT DOCUMENTS

| | | |
|---|---|---|
| JP | 05-152303 | 6/1993 |
| JP | 06-323310 | 11/1994 |
| JP | 10-189168 | 7/1998 |
| JP | 2001-332344 | 11/2001 |
| JP | 2002-246117 | 8/2002 |
| JP | 2003-45576 | 2/2003 |
| JP | 2006-40737 | 2/2006 |

* cited by examiner

*Primary Examiner*—Gary F. Paumen
(74) *Attorney, Agent, or Firm*—Dickstein Shapiro LLP

(57) ABSTRACT

An electronic component includes a substrate, an interconnection element, and a connector. The interconnection element has conductivity. The interconnection element is present over the substrate. The connector is present on the interconnection element. The connector may further include, but is not limited to, a base, at least one stopper, and at least one sloped guiding surface. The base projects from the interconnection element in a first direction that is vertical to the surface of the substrate. At least one stopper projects from the base in a second direction that is parallel to the surface of the substrate. The one stopper has a stopper surface.

8 Claims, 13 Drawing Sheets

ELECTRONIC COMPONENT AND METHOD OF FORMING THE SAME

BACKGROUND OF THE INVENTION

1. Field of the Invention

The present invention generally relates to an electronic component and a method of forming the same. More specifically, the present invention relates to a microconnector and a method of forming the same.

Priority is claimed on Japanese Patent Application No. 2007-183494, filed Jul. 12, 2007, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Microconnectors have been known which can be used to connect two electronic components. Each electronic component has a plurality of terminals that may, in some cases, be aligned at a narrow pitch. The microconnectors connect terminals of one electronic component and the other terminals of another electronic component. The microconnectors can be used to connect the terminals aligned at narrow pitch to the other terminals aligned at the pitch, at ordinary temperature, without using an anisotropic conductive film or solder.

Japanese Unexamined Patent Applications, First Publications, Nos. 10-189168, 2006-40737, 2003-45576, 2002-246117, and 2001-332344 disclose a microconnector that has a flexible beam. The flexible beam extends in parallel to the bonding face of a substrate. Japanese Unexamined Patent Application, First Publication, No. 5-152303 discloses manufacturing a microconnector made of a conductive rubber by using a printing technique.

In Japanese Unexamined Patent Applications, First Publications, Nos. 2006-40737, 2003-45576, 2002-246117, and 2001-332344, the microconnector extends straightly and in parallel to the bonding surface of the substrate. The microconnectors can be aligned at narrow pitch in a direction that is perpendicular to an axis of the beam. The microconnectors can not be aligned at narrow pitch in other direction that is parallel to the axis of the beam. Two electronic components can not be stacked in a direction vertical to the surface of the substrate.

As disclosed in Japanese Unexamined Patent Application, First Publication, No. 10-189168, the microconnector has a C-curved beam that is flexible. This microconnector can be aligned at narrower pitch as compared to the other microconnectors disclosed in Japanese Unexamined Patent Applications, First Publications, Nos. 2006-40737, 2003-45576, 2002-246117, and 2001-332344. The microconnectors disclosed in Japanese Unexamined Patent Application, First Publication, No. 10-189168 can allow electronic components to be stacked in the direction vertical to the surface of the substrate. Complicated manufacturing processes need to form the beams of microconnectors that extend parallel to the bonding surface of the substrate. Shrinkage of the microconnectors is not easy due to placing a magnet.

As disclosed in Japanese Unexamined Patent Application, First Publication, No. 2001-3320144, the microconnectors are formed by printing a conductive rubber. Shrinkage of the microconnectors is not easy. The microconnectors have poor mechanical durability.

In view of the above, it will be apparent to those skilled in the art from this disclosure that there exists a need for an improved microconnector and/or method of forming the same. This invention addresses this need in the art as well as other needs, which will become apparent to those skilled in the art from this disclosure.

SUMMARY OF THE INVENTION

Accordingly, it is a primary object of the present invention to provide a connector.

It is another object of the present invention to provide a connector that allows first and second electronic components to be stacked in a direction vertical to the surface of a substrate, wherein the first electronic component has a first two-dimensional alignment of terminals at narrow pitch, and the second electronic component has a second two-dimensional alignment of terminals at narrow pitch, and wherein the connector connects one of the first two-dimensional alignment of terminals and one of the second two-dimensional alignment of terminals.

It is a further object of the present invention to provide an electronic component that includes connectors.

It is a still further object of the present invention to provide an electronic component that includes connectors that allow this electronic component and other electronic component to be stacked in a direction vertical to the surface of a substrate, wherein the this electronic component has a first two-dimensional alignment of terminals at narrow pitch, and the other electronic component has a second two-dimensional alignment of terminals at narrow pitch, and wherein the connectors connect the first two-dimensional alignment of terminals and the second two-dimensional alignment of terminals.

It is yet a further object of the present invention to provide a method of forming a connector.

It is an additional object of the present invention to provide a method of forming an electronic component including connectors that allow this electronic component and other electronic component to be stacked in a direction vertical to the surface of a substrate, wherein the this electronic component has a first two-dimensional alignment of terminals at narrow pitch, and the other electronic component has a second two-dimensional alignment of terminals at narrow pitch, and wherein the connectors connect the first two-dimensional alignment of terminals and the second two-dimensional alignment of terminals.

In accordance with a first aspect of the present invention, an electronic component may include, but is not limited to, a substrate, an interconnection element, and a connector. The interconnection element has conductivity. The interconnection element is present over the substrate. The connector is present on the interconnection element. The connector may further include, but is not limited to, a base, at least one stopper, and at least one sloped guiding surface. The base projects from the interconnection element in a first direction that is vertical to the surface of the substrate. At least one stopper projects from the base in a second direction that is parallel to the surface of the substrate. The one stopper has a stopper surface.

The connector is snap-fitted with at least a portion of an external electrode, and the stopper holds the external electrode.

In some cases, the at least one sloped guiding surface may be sloped down inwardly, the stopper projects inwardly.

In other cases, the at least one sloped guiding surface may be sloped down outwardly, the stopper may project outwardly.

In some cases, the base may have a free end and a fixed end that is fixed to the interconnection element, and the at least one stopper projects from the free end.

In some cases, the base may include, but is not limited to, a plurality of beams which project from the surface interconnection in the vertical direction.

In other cases, the base may include, but is not limited to, a hollow beam which projects from the surface interconnection in the vertical direction.

In some cases, the base may be elastic and deformable.

In some cases, the base may be electrically conductive.

The electronic component includes at least one connector that is configured to be snap-fitted to an external electrode of a counterpart electronic component. A first typical example of the external electrode may be, but is not limited to, a projecting electrode having a head portion which is snap-fitted to the connector. In this case, the connector has a hollow structure that receives and holds the head portion of the projecting electrode. A second typical example of the external electrode may be, but is not limited to, an electrode having a hole which is snap-fitted to the connector. In this case, the hole of the electrode receives the connector so that the connector holds the electrode. The connector may be formed of a multi-layered conductive film structure that is present on the surface interconnection element. Using a photo-lithography technique allows forming a dense array of connectors at a narrow pitch.

In the first typical case, the external electrode is the projecting electrode having the head portion which is snap-fitted to the hollow portion of the connector. In this case, the at least one sloped guiding surface may be sloped down inwardly, and the at least one stopper projects inwardly. For connecting the electronic component to the counterpart electronic component, the head portion of the projecting electrode is made into contact slidably with the down-sloped guiding surface. Since the base may be elastic and deformable, forcing the head portion of the projecting electrode toward the down-sloped guiding surface may cause that the free end of the base moves outwardly until the head portion of the electrode is snapped into the hollow structure of the connector. The head portion of the projecting electrode is snap-fitted into the connector. The base being elastic may cause that the base fits and holds the head portion of the projecting electrode. The at least one stopper also holds the head portion of the projecting electrode. Since the base is electrically conductive, the connector and the projecting electrode are electrically connected. Using the connector allows that the electronic component and the counterpart electronic component are stacked each other over the substrate and both the components are electrically connected to each other. The elasticity and deformability of the base of the connector allows that the head portion of the projecting electrode is snap-fitted into the connector. Thus, a two-dimensional dense array at narrower pitch of the connectors over the substrate can be obtainable.

The projecting electrode can be designed in accordance with the shape of the hollow structure of the connector. The at least one stopper can be designed to adjust the force to disconnect or remove the projecting electrode from the hollow structure of the connector. The connector can connect the counterpart electronic component having the projecting electrode at ordinal temperature without using an ACF (Anisotropic Conductive Film) or solder, wherein the electronic component and the counterpart electronic component are staked at a narrow pitch in the direction vertical to the surface of the substrate.

In the second typical case, the external electrode is the electrode having the through hole which is snap-fitted to the connector. In this case, the at least one sloped guiding surface may be sloped down outwardly, and the at least one stopper projects outwardly. For connecting the electronic component to the counterpart electronic component, the electrode having the through hole is made into contact slidably with the down-sloped guiding surface. Since the base may be elastic and deformable, forcing the electrode toward the down-sloped guiding surface may cause that the free end of the base moves inwardly until the electrode with the through hole is snapped into the connector. The electrode with the through hole is snap-fitted into the connector. The base being elastic may cause that the base fits and holds the electrode. The at least one stopper also holds the electrode. Since the base is electrically conductive, the connector and the electrode are electrically connected. Using the connector allows that the electronic component and the counterpart electronic component are stacked each other over the substrate and both the components are electrically connected to each other. The elasticity and deformability of the base of the connector allows that the electrode is snap-fitted into the connector. Thus, a two-dimensional dense array at narrower pitch of the connectors over the substrate can be obtainable.

The electrode can be designed in accordance with the shape of the connector. The at least one stopper can be designed to adjust the force to disconnect or remove the electrode from the connector. The connector can connect the counterpart electronic component having the electrode at ordinal temperature without using an ACF (Anisotropic Conductive Film) or solder, wherein the electronic component and the counterpart electronic component are staked at a narrow pitch in the direction vertical to the surface of the substrate.

In accordance with a second aspect of the present invention, a method of forming an electronic component may include, but is not limited to, the following processes. An interconnection element having conductivity is formed over a substrate. A connector is formed on the interconnection element. The connector may include, but is not limited to, a base, at least one stopper, and at least one sloped guiding surface. The base projects from the interconnection element in a first direction that is vertical to the surface of the substrate. At least one stopper projects from the base in a second direction that is parallel to the surface of the substrate. The one stopper has a stopper surface.

In some cases, forming the connector may further include the following processes. A first dummy film is formed over the substrate. The first dummy film has a first opening over the interconnection element. A first conductive film is formed on the first dummy film and the interconnection element. A second dummy film is formed on the first conductive film. The second dummy film in combination with the first conductive film fills up the first opening. The second dummy film is selectively removed so that the second dummy film resides at the bottom of the first opening, while the first conductive film is exposed. A second conductive film is formed on the exposed surface of the first conductive film and on the residual second dummy film, thereby forming a hollow in the first opening. The first and second conductive films are selectively removed so that the first and second conductive films reside on the side walls of the first opening, while the first dummy film is exposed outside the first opening and the second dummy film is exposed inside the first opening. The first and second dummy films are removed.

In some cases, electively removing the first and second conductive films may include, but is not limited to, carrying out an anisotropic etching process.

In some cases, selectively removing the first and second conductive films may include, but is not limited to, carrying out an ion-milling process.

The first dummy film with the first opening is formed over the substrate. The first conductive film is formed on the bottom and side walls of the first opening. The second dummy film resides at the bottom of the first opening. A second conductive film is formed on the exposed surface of the first conductive film and on the residual second dummy film, thereby forming a hollow in the first opening. The first and second conductive films are selectively removed so that the first and second conductive films reside on the side walls of the first opening, while the first dummy film is exposed outside the first opening and the second dummy film is exposed inside the first opening. The first and second conductive films have the down-sloped surface that performs as the sloped-guiding surface when the selective removal is carried out by an anisotropic etching process or an ion-milling process. Removal of the second dummy film forms the bottom surfaces of the second conductive films. The bottom surfaces of the second conductive films perform as the stopper surfaces. After the first and second dummy films are removed, the first conductive film resides projecting from the surface interconnection in the direction vertical to the surface of the substrate.

The external electrode is the projecting electrode having the head portion which is snap-fitted to the hollow portion of the connector. In this case, the at least one sloped guiding surface may be sloped down inwardly, and the at least one stopper projects inwardly. For connecting the electronic component to the counterpart electronic component, the head portion of the projecting electrode is made into contact slidably with the down-sloped guiding surface. Since the base may be elastic and deformable, forcing the head portion of the projecting electrode toward the down-sloped guiding surface may cause that the free end of the base moves outwardly until the head portion of the electrode is snapped into the hollow structure of the connector. The head portion of the projecting electrode is snap-fitted into the connector. The base being elastic may cause that the base fits and holds the head portion of the projecting electrode. The at least one stopper also holds the head portion of the projecting electrode. Since the base is electrically conductive, the connector and the projecting electrode are electrically connected. Using the connector allows that the electronic component and the counterpart electronic component are stacked each other over the substrate and both the components are electrically connected to each other. The elasticity and deformability of the base of the connector allows that the head portion of the projecting electrode is snap-fitted into the connector. Thus, a two-dimensional dense array at narrower pitch of the connectors over the substrate can be obtainable.

The projecting electrode can be designed in accordance with the shape of the hollow structure of the connector. The at least one stopper can be designed to adjust the force to disconnect or remove the projecting electrode from the hollow structure of the connector. The connector can connect the counterpart electronic component having the projecting electrode at ordinal temperature without using an ACF (Anisotropic Conductive Film) or solder, wherein the electronic component and the counterpart electronic component are staked at a narrow pitch in the direction vertical to the surface of the substrate.

In some cases, the method may further include the following process. At least one slit is formed in a projecting portion of the first and second conductive films, after forming the second conductive film, wherein the projecting portion projects from the surface interconnection in the vertical direction.

Forming the at least one slit forms a plurality of the beams that projects from the interconnection element in the direction vertical to the surface of the substrate. The beams each have a free end and a fixed end that is fixed to the interconnection element. The beams are elastic and deformable. The free ends of the beams can move toward each other and away from each other. This structure may allow the connector to be snap-fitted to the external electrode.

In some cases, forming the connector may further include the following processes. A first dummy film is formed over the substrate. The first dummy film has a first opening over the interconnection element. A first conductive film is formed on the first dummy film and the interconnection element. A second dummy film is formed on the first conductive film and on the first dummy film. The second dummy film in combination with the first conductive film fills up the first opening. The first conductive film and the second dummy film are selectively removed so that the first dummy film is exposed, while the first conductive film and the second dummy film reside inside the first opening. The first dummy film is selectively removed so that the first conductive film and the second dummy film have a first projecting portion that projects from the surface of the first dummy film. A second conductive film is formed on the first dummy film, the first conductive film and the second dummy film. The second conductive film is selectively removed so that the second conductive film reside on the side walls of the first projecting portion. The first and second dummy films are removed.

In some cases, selectively removing the first conductive film and the second dummy film may include, but is not limited to, carrying out at least one of grinding and polishing processes.

In some cases, selectively removing the second conductive film may include, but is not limited to, carrying out an anisotropic etching process.

The second dummy film in combination with the first conductive film fills up the first opening of the first dummy film. The first conductive film and the second dummy film are selectively removed so that the first dummy film is exposed, while the first conductive film and the second dummy film reside inside the first opening. The first dummy film is selectively removed so that the first conductive film and the second dummy film have a first projecting portion that projects from the surface of the first dummy film. A second conductive film is formed on the first dummy film, the first conductive film and the second dummy film. The second conductive film is selectively removed so that the second conductive film reside on the side walls of the first projecting portion formed by the first conductive film and the second dummy film. The first and second dummy films are removed. The second conductive film has the down-sloped surface that performs as the sloped-guiding surface when the selective removal is carried out by an anisotropic etching process. Removal of the first dummy film forms the bottom surfaces of the second conductive films. The bottom surfaces of the second conductive films perform as the stopper surfaces. After the first and second dummy films are removed, the first conductive film resides projecting from the surface interconnection in the direction vertical to the surface of the substrate.

The external electrode is the electrode having the through hole which is snap-fitted to the connector. In this case, the at least one sloped guiding surface may be sloped down outwardly, and the at least one stopper projects outwardly. For connecting the electronic component to the counterpart electronic component, the electrode having the through hole is made into contact slidably with the down-sloped guiding surface. Since the base may be elastic and deformable, forcing the electrode toward the down-sloped guiding surface may cause that the free end of the base moves inwardly until the electrode with the through hole is snapped into the connector. The electrode with the through hole is snap-fitted into the connector. The base being elastic may cause that the base fits and holds the electrode. The at least one stopper also holds the electrode. Since the base is electrically conductive, the connector and the electrode are electrically connected. Using the connector allows that the electronic component and the counterpart electronic component are stacked each other over the substrate and both the components are electrically connected to each other. The elasticity and deformability of the base of the connector allows that the electrode is snap-fitted into the connector. Thus, a two-dimensional dense array at narrower pitch of the connectors over the substrate can be obtainable.

The electrode can be designed in accordance with the shape of the connector. The at least one stopper can be designed to adjust the force to disconnect or remove the electrode from the connector. The connector can connect the counterpart electronic component having the electrode at ordinal temperature without using an ACF (Anisotropic Conductive Film) or solder, wherein the electronic component and the counterpart electronic component are staked at a narrow pitch in the direction vertical to the surface of the substrate.

In some cases, the method may further include, but is not limited to, the following process. At least one slit is formed in a second projecting portion of the first and second conductive films, after forming the second conductive film, wherein the second projecting portion projects from the surface interconnection in the vertical direction.

Forming the at least one slit forms a plurality of the beams that projects from the interconnection element in the direction vertical to the surface of the substrate. The beams each have a free end and a fixed end that is fixed to the interconnection element. The beams are elastic and deformable. The free ends of the beams can move toward each other and away from each other. This structure may allow the connector to be snap-fitted to the external electrode.

In some cases, forming the connector may further include, but is not limited to, the following processes. A first dummy film is formed over the substrate. The first dummy film has a first opening over the interconnection element. A dummy separating film is formed on the surface interconnection and the first dummy film. The dummy separating film separates the first opening into a first plurality of opening sections. A second dummy film is formed on the first dummy film. The second dummy film has a second opening which encompasses the first opening. A conductive film is formed both within and over the first plurality of opening sections. At least an adjacent part of the second dummy film is removed, the adjacent part being adjacent to the conductive film, so that the dummy separating film and the conductive film have a projecting portion. The projecting portion is tapered. The first and second dummy films are removed.

In some cases, tapering the projecting portion may include, but is not limited to, carrying out an ion-milling process.

The dummy separating film separates the first opening into a first plurality of opening sections. The second dummy film with a second opening which encompasses the first opening is formed on the first dummy film. The conductive film is formed both within and over the first plurality of opening sections. At least an adjacent part of the second dummy film is removed, the adjacent part being adjacent to the conductive film, so that the dummy separating film and the conductive film have a projecting portion. The projecting portion is tapered by the ion-milling process, thereby forming the down-sloped surface that performs as the sloped-guiding surface. Removal of the first dummy film forms the bottom surfaces of the second conductive films. The bottom surfaces of the second conductive films perform as the stopper surfaces. After the first and second dummy films are removed, the first conductive film resides projecting from the surface interconnection in the direction vertical to the surface of the substrate. The connector can connect the counterpart electronic component having the electrode at ordinal temperature without using an ACF (Anisotropic Conductive Film) or solder, wherein the electronic component and the counterpart electronic component are staked at a narrow pitch in the direction vertical to the surface of the substrate.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1A:
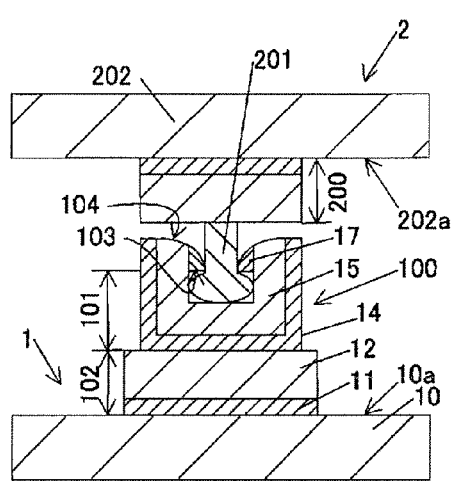
FIG. 1A is a cross sectional elevation view illustrating a first electronic component and a second electronic component that is connected to the first electronic component 1 in accordance with a first preferred embodiment of the present invention.
Figure 1B:
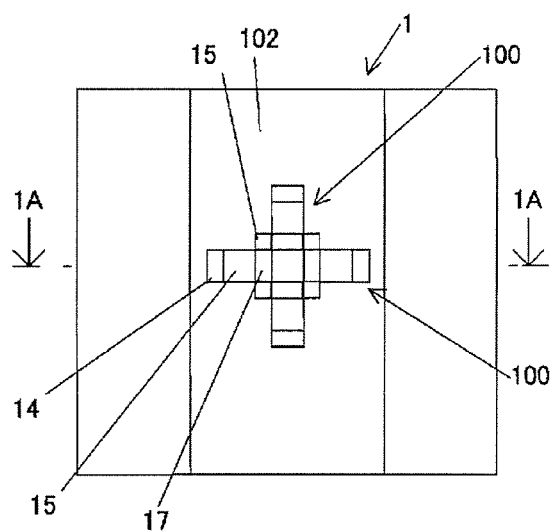
FIG. 1B is a plan view illustrating the first electronic component shown in FIG. 1A which is a view taken along a 1A-1A line of FIG. 1B.

Configurations of Electronic Components:

FIG. 1A is a cross sectional elevation view illustrating a first electronic component 1 and a second electronic component 2 that is connected to the first electronic component 1 in accordance with a first preferred embodiment of the present invention. FIG. 1B is a plan view illustrating the first electronic component shown in FIG. 1A which is a view taken along a 1A-1A line of FIG. 1B.

First Electronic Component 1:

A first electronic component 1 can be configured to be connected to a second electronic component 2. In some cases, the first electronic component 1 may include, but is not limited to, a substrate 10, and a connector 100. The substrate 10 may have a bonding surface 10a that has a conductive interconnection element thereon such as a surface interconnection 102. In some cases, the surface interconnection 102 may include, but is not limited to, a multilayered structure of a seed layer 11 and a conductive film 12.

The connector 100 may be provided on the surface interconnection 102. The connector 100 may project from the surface interconnection 102 in the direction that is vertical to the bonding surface 10a of the substrate 10. The bonding surface 10a faces to, but is separate from, the second electronic component 2 when the first electronic component 1 is connected to the second electronic component 2.

In some cases, the connector 100 of the first electronic component 1 can be implemented by a microconnector that is configured to receive a projecting electrode 201 of the second electronic component 2 when the projecting electrode 201 is snap-fitted to the microconnector. In some cases, the connector 100 may include, but is not limited to, a base 101, and a plurality of beams with supported ends and free ends, and stoppers 17. The stoppers 17 have stopper faces 103. The free ends and the stoppers 17 in combination form guiding surfaces 104. The connector 100 can be implemented by a multi-layered structure of conductive films on the surface interconnection 102.

In some cases, the base 101 may have a bottom that is bonded to the surface interconnection 102. The base 101 may have a plurality of beams that project in the direction vertical to the bonding surface 10a of the substrate 10. The beam has a supported end and a free end. The supported end is proximal to the bonding surface 10a of the substrate 10. The free end is distal from the bonding surface 10a of the substrate 10. The beam may have elasticity and deformability so as to allow the free end to be movable in the direction parallel to the bonding surface 10a of the substrate 10, while the supported end being fixed. Namely, the beams are elastic and deformable so that the free ends of the plurality of beams are movable toward and away from each other.

The stoppers 17 are attached to the free ends of the beams. The stoppers 17 project toward each other from the free ends in the horizontal direction. The stopper faces 103 faces toward the base 101. The stopper faces 103 of the stoppers 17 that are attached to the free ends of the beams extend horizontally toward each other. When the first electronic component 1 is connected to the second electronic component 2 while the projecting electrode 201 being snap-fitted to the connector 100 of the first electronic component 1, then the stoppers 17 with the stopper surfaces 103 extend toward the center axis of the projecting electrode 201, while the stopper surfaces 103 face to the expanded head of the projecting electrode 201.

The stoppers 17 and the beams of the connector 1 define a hollow with an opening such that the expanded head of the projecting electrode 201 is snap-fitted to the hollow through the opening when the first and second electronic components 1 and 2 are made into connection with each other.

In some cases, the guiding surfaces 104 may extend over the free ends and the stoppers 17. The guiding surfaces 104 may be implemented by sloped surfaces that are sloped down as the position comes closer to the center axis of the connector 100. The downward direction is defined to be a direction from the free ends of the beams toward the bonding surface 10a of the substrate 10, wherein the direction is vertical to the bonding surface 10a of the substrate 10. The sloped surfaces make it easier that the expanded head of projecting electrode 201 is snap-fitted to the hollow of the connector 100 through it opening. In some cases, the sloped surfaces may curve outward in the middle. The sloped surfaces may curve convexly. The convex surface of the expanded head of the projecting electrode 201 is made into contact slidably with the guiding surface 104 and then the expanded head of the projecting electrode 201 is snap-fitted to the hollow of the connector 100, when the first and second electronic components 1 and 2 are made into connection with each other. The expanded head of the projecting electrode 201 is then fitted to and held in the connector 100 by the stoppers 17.

Second Electronic Component 2:

In some cases, the second electronic component 2 may include, but is not limited to, a substrate 202, and a plurality of projecting electrodes 201. The substrate 202 may have a bonding surface 202a that has a conductive interconnection element thereon such as a surface interconnection 200. The plurality of projecting electrodes 201 may be provided on the surface interconnection 200. The plurality of projecting electrodes 201 may project from the surface interconnection 200 in the direction that is vertical to the bonding surface 202a of the substrate 202. The bonding surface 202a faces to, but is separate from, the first electronic component 1 when the first electronic component 1 is connected to the second electronic component 2.

The projecting electrode 201 may project from the surface interconnection 200 in the direction that is vertical to the bonding surface 202a of the substrate 202. The projecting electrode 201 may include, but is not limited to, a body and an expanded head. The body of the projecting electrode 201 is attached to the surface interconnection 200. The expanded head is wider than the body. In some cases, the expanded head of the projecting electrode 201 may be shaped in, but not limited to, flattened-sphere. The expanded head of the projecting electrode 201 may have a convex surface that curves outwards in the middle. The expanded head of the projecting electrode 201 is wider than the body thereof, so that the expanded head is held by the stoppers 17 after the expanded head of the projecting electrode 201 has been snap-fitted to the hollow of the connector 100. The convex surface of the expanded head of the projecting electrode 201 and the guiding surface 104 being convex make it easier that the expanded head of the projecting electrode 201 is snap-fitted to the hollow of the connector 100.

For connecting the first and second electronic components 1 and 2, the convex surface of the expanded head of the projecting electrode 201 is made into contact slidably with the guiding surfaces 104 of the first electronic component 1. When the first and second electronic components 1 and 2 are forced toward each other, the beams of the connector 100 are bent or deformed elastically outwardly so that the free ends of the beams move outward and away from each other. As a result, the stoppers 17 attached to the free ends of the beams of the connector 100 also move away from each other and the opening becomes wider so that the expanded head of the projecting electrode 201 is snap-fitted to the hollow of the connector 100. The expanded head of the projecting electrode 201 is held by the stoppers 17 that are attached to the free ends of the elastic beams of the connector 100. In other words, the expanded head of the projecting electrode 201 is held in the hollow by the elastic force given by the elastic beams of the connector 100.

Figure 1C:
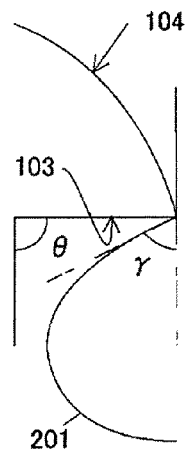
FIG. 1C is a fragmentary cross sectional elevation view illustrating an expanded head of a projecting electrode of a second electronic component and a stopper of the connector of the first electronic component shown in FIG. 1A.

FIG. 1C is a fragmentary cross sectional elevation view illustrating the expanded head of the projecting electrode 201 of the second electronic component 2 and the stopper 104 of the connector 100 of the first electronic component 1 shown in FIG. 1A. The removing force that needs to remove the expanded head of the projecting electrode 201 from the hollow of the connector 100 can be estimated by taking into consideration a first slope angle $\theta$, a second slope angle $\gamma$ and the rigidity and elasticity of the beams. The first slope angle $\theta$ is the sloped angle of the stopper surface 103 of the stopper 17 of the connector 100. The second slope angle $\gamma$ is the slope angle of the expanded head with reference to the body of the projecting electrode 201.

In some cases, the projecting electrode can be formed by, but not limited to, the following processes. A dummy film is prepared. An isotropic etching process is carried out to form a semi-spherical concave in the dummy film. An anisotropic etching process is then carried out to form a penetrating hole which communicates between the interconnection element 200 and the bottom of the semi-spherical concave. A conductive film is isotropically grown from the interconnection element 200.

Use of Electronic Components:

For connecting the first and second electronic components 1 and 2, the convex surface of the expanded head of the projecting electrode 201 is made into contact slidably with the slope guiding surfaces 104 of the first electronic component 1. When the first and second electronic components 1 and 2 are forced toward each other, the beams of the connector 100 are bent or deformed elastically outwardly so that the free ends of the beams move outward and away from each other. As a result, the stoppers 17 attached to the free ends of the beams of the connector 100 also move away from each other and the opening becomes wider so that the expanded head of the projecting electrode 201 is snap-fitted to the hollow of the connector 100. The expanded head of the projecting electrode 201 is surrounded and held by the connector 100, while the expanded head of the projecting electrode 201 is fitted to and contacts with the connector 100, thereby making electrical connection. When no external force is applied to remove the expanded head of the projecting electrode 201 from the hollow of the connector 100, the expanded head of the projecting electrode 201 is held in the hollow of the connector 100. The elastic force given by the elastic beam can allow that the expanded head of the projecting electrode 201 is removed from the hollow of the connector 100 by applying an external force is applied to remove the expanded head of the projecting electrode 201 from the hollow of the connector 100.

Applying the other force to one of the first and second electronic components 1 and 2 toward the other thereof may cause that the expanded head of the projecting electrode 201 is snap-fitted to the hollow of the connector 100 so that the projecting electrode 201 is fitted to the connector 100 by the elastic force given by the elastic beams of the connector 100. The projecting electrode 201 contacts with the connector 100 while the first and second electronic components 1 and 2 are connected to each other. Using the connector 100 allows the first and second electronic components 1 and 2 are stacked each other and electrically connected to each other.

In general, sole use of the connector 100 may provide a mechanical connecting strength between the first and second electronic components 1 and 2, provided that the mechanical connecting strength may depend on the size of the connector 100. In some cases, the mechanical connecting strength given by sole use of the connector 100 may be increased by using additional measures. In some cases, a mechanical reinforcement may be available to increase the mechanical connecting strength between the first and second electronic components 1 and 2. Typical examples of the mechanical reinforcement may include, but are not limited to, removable mechanical reinforcement members such as clips and tapes for binding the first and second electronic components 1 and 2. Other typical examples of the mechanical reinforcement may include, but are not limited to, a bonding material that is filled into between the substrate 10 of the first electronic component 1 and the substrate 202 of the second electronic component 202. Typical examples of the bonding material may include, but are not limited to, thermoplastic resins. In other cases, it might be preferable that a noble metal such as Au, Pt and Pd is formed on the surface of the connector 100 to improve the corrosion resistance of the connector 100.

The stoppers 17 are attached to the free ends of the beams of the connector 100. The stoppers 17 project toward the projecting electrode 201 from the free ends in the horizontal direction. When no external force is applied to remove the expanded head of the projecting electrode 201 from the hollow of the connector 100, the expanded head of the projecting electrode 201 is held in the hollow of the connector 100 by the elastic force given by the beam and by the stoppers 17. The elastic force given by the elastic beam can allow that the expanded head of the projecting electrode 201 is removed from the hollow of the connector 100 by applying an external force is applied to remove the expanded head of the projecting electrode 201 from the hollow of the connector 100. The sectioned shape of the stoppers 17 may be modified in view of whether the projecting electrode 201 can be removed easily or hardly from the hollow of the connector 100. The connector 100 can be used alone or in combination with the other mechanical connecting members such as the clips or tapes without, however, using any solder or ACF. The connector 100 may allow that the first and second electronic components 1 and 2 are removably connected to each other without breaking the first and second electronic components 1 and 2. The connector 100 may also allow that the first and second electronic components 1 and 2 are repaired or recycled.

Second Embodiment

Figure 2A:
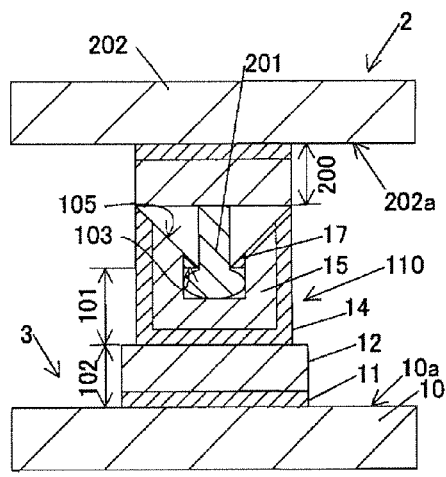
FIG. 2A is a cross sectional elevation view illustrating a third electronic component and the second electronic component that is connected to the third electronic component in accordance with a second preferred embodiment of the present invention.
Figure 2B:
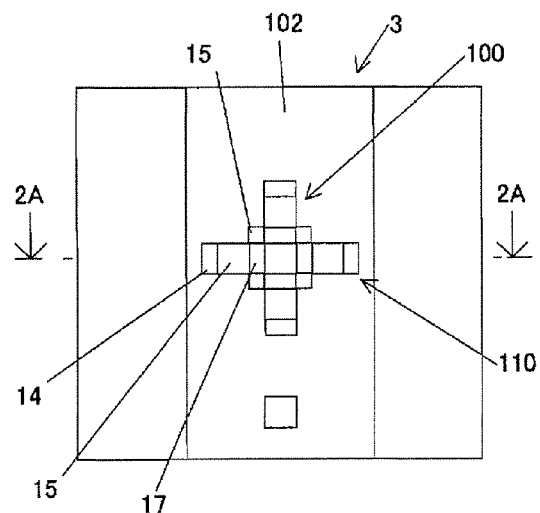
FIG. 2B is a plan view illustrating the third electronic component shown in FIG. 2A which is a view taken along a 2A-2A line of FIG. 2B.

Configurations of Electronic Components:

FIG. 2A is a cross sectional elevation view illustrating a third electronic component 3 and the second electronic component 2 that is connected to the third electronic component 3 in accordance with a second preferred embodiment of the present invention. FIG. 2B is a plan view illustrating the third electronic component shown in FIG. 2A which is a view taken along a 2A-2A line of FIG. 2B.

The second electronic component 2 of this embodiment is the same as the second electronic component 2 of the first embodiment. The third electronic component 3 of this embodiment is different from the first electronic component 1 of the first embodiment. The third electronic component 3 may have guiding surfaces 105 which are sloped down toward the center of the connector 100. In some cases, the guiding surfaces 105 may be sloped planes and non-curved surfaces. In particular cases, the sloped planes may have an angle of about 45 degrees. The downward direction is defined to be a direction from the free ends of the beams toward the bonding surface 10a of the substrate 10, wherein the direction is vertical to the bonding surface 10a of the substrate 10.

Third Embodiment

Figure 3A:
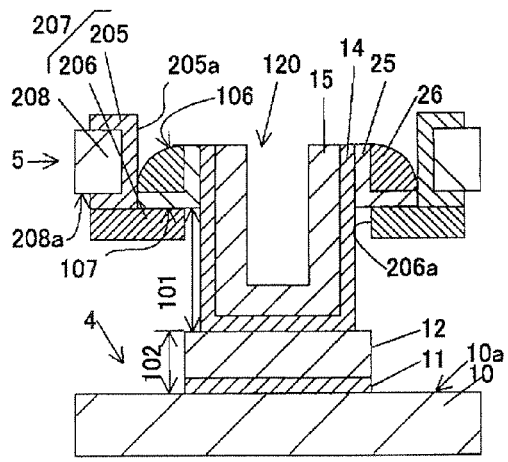
FIG. 3A is a cross sectional elevation view illustrating a fourth electronic component and a fifth electronic component that is connected to the fourth electronic component in accordance with a third preferred embodiment of the present invention.
Figure 3B:
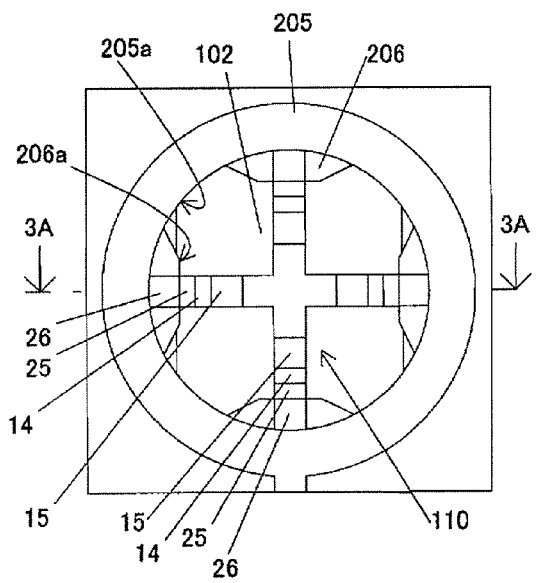
FIG. 3B is a plan view illustrating the third electronic component shown in FIG. 3A which is a view taken along a 3A-3A line of FIG. 3B.

Configurations of Electronic Components:

FIG. 3A is a cross sectional elevation view illustrating a fourth electronic component 4 and a fifth electronic component 5 that is connected to the fourth electronic component 4 in accordance with a third preferred embodiment of the present invention. FIG. 3B is a plan view illustrating the third electronic component shown in FIG. 3A which is a view taken along a 3A-3A line of FIG. 3B.

Fourth Electronic Component 4:

A fourth electronic component 4 can be configured to be connected to a fifth electronic component 5. In some cases, the fourth electronic component 4 may include, but is not limited to, a substrate 10, and a connector 120. The substrate 10 may have a bonding surface 10a that has a conductive interconnection element thereon such as a surface interconnection 102. In some cases, the surface interconnection 102 may include, but is not limited to, a multilayered structure of a seed layer 11 and a conductive film 12.

The connector 120 may be provided on the surface interconnection 102. The connector 120 may project from the surface interconnection 102 in the direction that is vertical to the bonding surface 10a of the substrate 10. The bonding surface 10a faces to, but is separate from, the fifth electronic component 5 when the fourth electronic component 4 is connected to the fifth electronic component 5.

In some cases, the connector 120 of the fourth electronic component 4 can be implemented by a microconnector that is configured to be snap-fitted to electrodes 207 of the fifth electronic component 5. In some cases, the connector 120 may include, but is not limited to, a base 101, and a plurality of beams with supported ends and free ends, and stoppers 25, 26. The stoppers 25, 26 have stopper faces 107. The free ends and the stoppers 25, 26 in combination form guiding surfaces 106. The connector 120 can be implemented by a multi-layered structure of conductive films on the surface interconnection 102. The stoppers 25, 26 may have first and second parts 25 and 26. The second part 26 of the stopper contacts with the free end of the connector 120. The second part 26 has the stopper face 107.

In some cases, the base 101 may have a bottom that is bonded to the surface interconnection 102. The base 101 may have a plurality of beams that project in the direction vertical to the bonding surface 10a of the substrate 10. The beam has a supported end and a free end. The supported end is proximal to the bonding surface 10a of the substrate 10. The free end is distal from the bonding surface 10a of the substrate 10. The beam may have elasticity and deformability so as to allow the free end to be movable in the direction parallel to the bonding surface 10a of the substrate 10, while the supported end being fixed. Namely, the beams are elastic and deformable so that the free ends of the plurality of beams are movable toward and away from each other.

The stoppers 25, 26 are attached to the free ends of the beams. The stoppers 25, 26 project outward from the free ends in the horizontal direction. The stoppers 25, 26 extend away from each other. The stopper faces 107 faces toward the base 101. The stopper faces 107 of the stoppers 25, 26 that are attached to the free ends of the beams extend horizontally away from each other. When the fourth electronic component 4 is connected to the fifth electronic component 5 while the electrode 201 being snap-fitted to the connector 120 of the fourth electronic component 4, then the stoppers 25, 26 with the stopper surfaces 107 extend outward and toward the electrode 207 from the free end.

The electrode 207 of the fifth electronic component 5 may include, but is not limited to, first and second parts 205 and 206. The first part 205 has a ring-shape and a first through hole with a first diameter. The first part 205 in ring-shape has the center axis which is aligned to the center axis of the connector 120. The second parts 206 are attached to the bottom of the first part 205. The second parts 206 extend inwardly toward the center axis from the bottom of the first part 205. The first part 205 has an inside wall 205a. The second parts 206 have inside walls 206a.

When the fourth and fifth electronic components 4 and 5 are connected to each other, the stoppers 25, 26 of the connector 120 extend outwardly from the free end of the beam of the connector 120. The stoppers 25, 26 of the connector 120 extend toward the first part 205 of the electrode 207, while the stopper surfaces 107 contacting with the upper surfaces of the second parts 206 which extend inwardly from the bottom of the first part 205. The outside edges of the stoppers 25, 26 of the connector 120 contact with the inside wall 205a of the first part 205 of the electrode 207, while the base 101 of the connector 120 is separate from the inside walls 206a of the second parts 206 of the In some cases, the guiding surfaces 106 may extend over the free ends and the stoppers 25, 26. The guiding surfaces 106 may be implemented by sloped surfaces that are sloped down outwardly. The downward direction is defined to be a direction from the free ends of the beams toward the bonding surface 10a of the substrate 10, wherein the direction is vertical to the bonding surface 10a of the substrate 10. The sloped surfaces make it easier that the electrode 207 is snap-fitted to and engaged with the stoppers 25, 26. In some cases, the sloped surfaces may curve outward in the middle. The sloped surfaces may curve convexly. The convex surface of the stoppers 25, 26 is made into contact slidably with the second parts 206 of the electrode 207 and then the second parts 206 of the electrode 207 are engaged with the stopper surfaces 107. Thus, the electrode 207 is held by the stoppers 25, 26 of the connector 120.

Fifth Electronic Component 5:

In some cases, the fifth electronic component 5 may include, but is not limited to, an insulating substrate 208, and the electrode 207 supported by the insulating substrate 208. The electrode 207 may include, but is not limited to, the first and second parts 205 and 206. The first part 205 has the ring-shape and the first through hole with the first diameter. The first part 205 in ring-shape has the center axis which is aligned to the center axis of the connector 120 when the fourth and fifth electronic components 4 and 5 are connected to each other. The second parts 206 are attached to the bottom of the first part 205. The second parts 206 extend inwardly toward the center axis from the bottom of the first part 205. The first part 205 has an inside wall 205a. The second parts 206 have inside walls 206a. In plan view, the inside wall 205a of the first part 205 encompasses the inside walls 206a of the second parts 206.

The second parts 206 of the electrode 207 has the inside wall 206a that defines the smaller through hole than the through hole defined by the inside wall 205a of the first part 205. Thus, the second parts 206 are held by the stoppers 25, 26 after the second parts 206 of the electrode 207 have been snap-fitted to the stoppers 25, 26 of the connector 120. The guiding surface 106 being convex makes it easier that the electrode 207 is snap-fitted to the stoppers 25, 26 of the connector 120.

For connecting the fourth and fifth electronic components 4 and 5, the second parts 206 of the electrode 207 are made into contact slidably with the guiding surfaces 106 of the fourth electronic component 4. When the fourth and fifth electronic components 4 and 5 are forced toward each other, the beams of the connector 120 are bent or deformed elastically inwardly so that the free ends of the beams move inward and toward each other. As a result, the stoppers 25, 26 attached to the free ends of the beams of the connector 120 also move toward each other and the opening of the beams becomes narrower so that the second parts 206 of the electrode 207 are snap-fitted to the stoppers 25, 26 of the connector 120. The second parts 206 of the electrode 207 are held by the stoppers 25, 26 that are attached to the free ends of the elastic beams of the connector 120. In other words, the second parts 206 of the electrode 207 are held by the elastic force given by the elastic beams of the connector 120. The elastic force can prevent that the fourth and fifth electronic components 4 and 5 are disconnected from each other unless an additional force for disconnection is applied to the fourth and fifth electronic components 4 and 5.

The electrode 207 can be formed as follows. The insulating substrate 208 is prepared. A through hole is formed in the insulating substrate 208. The first part 205 of a conductive film with the inside wall 205a is formed on the insulating substrate 208 by using a photo-resist mask and an electroless plating process. A dummy film is formed which fills up the through hole defined by the inside wall 205a of the first part 205 to form another conductive film so that the second parts 206 of the conductive film with the inside walls 206a are formed by an etching process using a photo-resist mask.

Use of Electronic Components:

The connector 120 of the fourth electronic component 4 can be implemented by a microconnector that is configured to be snap-fitted to electrodes 207 of the fifth electronic component 5. In some cases, the connector 120 may include, but is not limited to, the base 101, and the beams or beams with supported ends and free ends, and stoppers 25, 26.

When the fourth and fifth electronic components 4 and 5 are forced toward each other to connect the fourth and fifth electronic components 4 and 5, the second parts 206 of the electrode 207 are made into contact slidably with the guiding surfaces 106 of the fourth electronic component 4. The beams of the connector 120 are bent or deformed elastically inwardly so that the free ends of the beams move inward and toward each other. As a result, the stoppers 25, 26 attached to the free ends of the beams of the connector 120 also move toward each other and the opening of the beams becomes narrower so that the second parts 206 of the electrode 207 are snap-fitted to the stoppers 25, 26 of the connector 120. The second parts 206 of the electrode 207 are held by the stoppers 25, 26 that are attached to the free ends of the elastic beams of the connector 120. In other words, the second parts 206 of the electrode 207 are held by the elastic force given by the elastic beams of the connector 120. The elastic force can prevent that the fourth and fifth electronic components 4 and 5 are disconnected from each other unless an additional force for disconnection is applied to the fourth and fifth electronic components 4 and 5.

Applying the other force to one of the fourth and fifth electronic components 4 and 5 toward the other thereof may cause that the second parts 206 of the electrode 207 are snap-fitted to the stoppers 25, 26 of the connector 120 so that the electrode 207 is fitted to the connector 120 by the elastic force given by the elastic beams of the connector 120. The electrode 207 contacts with the connector 120 while the fourth and fifth electronic components 4 and 5 are connected to each other. Using the connector 120 allows the fourth and fifth electronic components 4 and 5 are stacked each other and electrically connected to each other.

In general, sole use of the connector 120 may provide a mechanical connecting strength between the fourth and fifth electronic components 4 and 5, provided that the mechanical connecting strength may depend on the shape and dimension of the second parts 206 of the electrode 207. The increase of the width of the second parts 206 of the electrode 207 increases the mechanical connecting strength. Adjustment of the width of the second parts 206 of the electrode 207 can adjust the mechanical connecting strength. Decrease of the width of the second parts 206 of the electrode 207 increases the flexibility of the second parts 206 of the electrode 207. When the fourth and fifth electronic components 4 and 5 are connected to each other, the beams of the connector 120 and the second parts 206 of the electrode 207 are deformed so that the second parts 206 of the electrode 207 are snap-fitted to the stoppers 25, 26.

It is also possible as a modification that the electrode 207 has the second part 206 which omnidirectionally and continuously extends inward from the inside wall 205a of the first part 205 of the electrode 207. In this case, when the fourth and fifth electronic components 4 and 5 are connected to each other, the beams of the connector 120 are deformed so that the second part 206 of the electrode 207 is snap-fitted to the stoppers 25, 26.

In some cases, the mechanical connecting strength given by sole use of the connector 120 may be increased by using additional measures. In some cases, a mechanical reinforcement may be available to increase the mechanical connecting strength between the fourth and fifth electronic components 4 and 5. Typical examples of the mechanical reinforcement may include, but are not limited to, removable mechanical reinforcement members such as clips and tapes for binding the fourth and fifth electronic components 4 and 5.

The connector 120 can be used alone or in combination with the other mechanical connecting members such as the clips or tapes without, however, using any solder or ACF. The connector 120 may allow that the fourth and fifth electronic components 4 and 5 are removably connected to each other without breaking the fourth and fifth electronic components 4 and 5. The connector 120 may also allow that the fourth and fifth electronic components 4 and 5 are repaired or recycled.

Fourth Embodiment

Figure 4A:
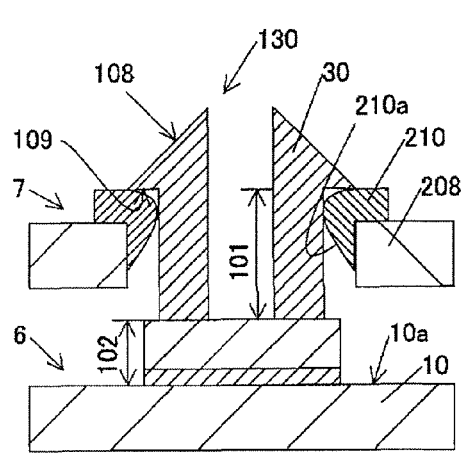
FIG. 4A is a cross sectional elevation view illustrating a sixth electronic component and a seventh electronic component that is connected to the sixth electronic component in accordance with a fourth preferred embodiment of the present invention.
Figure 4B:
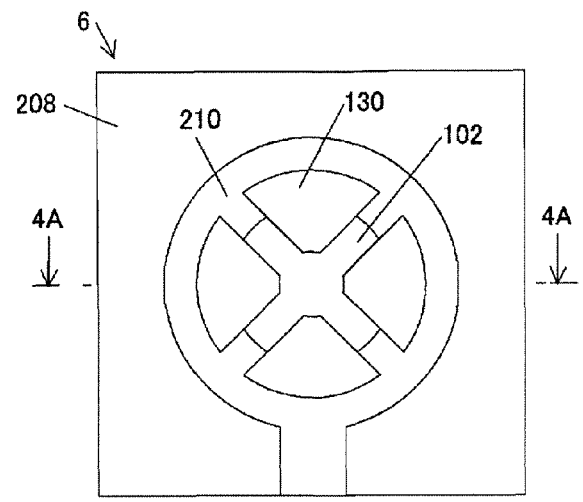
FIG. 4B is a plan view illustrating the sixth and seventh electronic components shown in FIG. 4A which is a view taken along a 4A-4A line of FIG. 4B.

Configurations of Electronic Components:

FIG. 4A is a cross sectional elevation view illustrating a sixth electronic component 6 and a seventh electronic component 7 that is connected to the sixth electronic component 6 in accordance with a fourth preferred embodiment of the present invention. FIG. 4B is a plan view illustrating the sixth and seventh electronic components shown in FIG. 4A which is a view taken along a 4A-4A line of FIG. 4B.

The sixth electronic component 6 of this embodiment is different from the fourth electronic component 4 of the first embodiment. The sixth electronic component 6 may have guiding surfaces 108 which are sloped down outwardly. The downward direction is defined to be a direction from the free ends of the beams toward the bonding surface 10a of the substrate 10, wherein the direction is vertical to the bonding surface 10a of the substrate 10. In some cases, the guiding surfaces 108 may be sloped planes and non-curved surfaces. In particular cases, the sloped planes may have an angle of about 45 degrees.

In some cases, the sixth electronic component 6 may have a plurality of beams which are separate from each other. The plurality of beams is attached to the surface interconnection 102. In some cases, the sixth electronic component 6 may have four beams which have the guiding surface 108. In other cases, the sixth electronic component 6 may have a beam. The beam or beams are elastic. The beams have free ends have stoppers with stopper surfaces 109 and the guiding surfaces 108.

The seventh electronic component 7 may include, but is not limited to, an insulating substrate 208 and an electrode 210 supported by the insulating substrate 208. The electrode 210 is attached to the inside wall of the trough hole of the insulating substrate 208. The electrode 210 has a ring-shape. The electrode 210 can be snap-fitted to the stoppers with the stopper surfaces 109 of the connector 130.

Fifth Embodiment

Method of Forming Electronic Components:

A method of forming the first electronic component 1 shown in FIGS. 1A and 1B will be described. FIGS. 5 through 12 and FIG. 13A are cross sectional elevation views illustrating a method of forming the first electronic component 1 shown in FIGS. 1A and 1B. FIG. 13B is a plan view of the first electronic component 1 shown in FIG. 13A which illustrates it taken along a 13A-13A line thereof.

Figure 5:
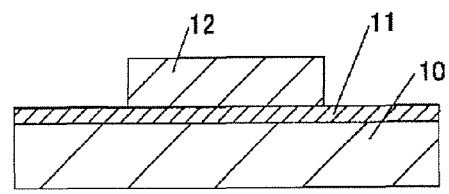
FIG. 5 is a cross sectional elevation view illustrating a step involved in a method of forming a first electronic component shown in FIGS. 1A and 1B along a 1A-1A line thereof.

As shown in FIG. 5, a substrate 10 is prepared. A seed layer 11 is formed on the entire surface of the substrate 10. A conductive film 12 is formed on the seed layer 11. The conductive film 12 is selectively etched to form a predetermined pattern of the conductive film 12 on the seed layer 11. Typical examples of the material for the substrate 10 may include, but are not limited to, insulating materials such as glasses, ceramics, and resins. In some cases, the seed layer 11 can be formed by, but not limited to, a sputtering process for sputtering a metal such as Cu or Ni-alloy. In other cases, the seed layer 11 can be formed by, but not limited to, application of a conductive paste onto the surface of the substrate 10. In other cases, the seed layer 11 can be formed by, but not limited to, blowing a conductive ink onto the surface of the substrate 10. Typical examples of the material for the conductive film 12 may include, but are not limited to, metals such as Cu, or Ni-alloy. In some cases, the conductive film 12 may be formed by electrolytic plating, electroless plating, or pulse-plating. The conductive film 12 may be etched selectively by using a photo-resist mask.

Figure 6:
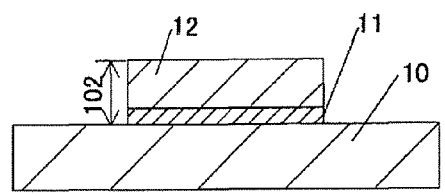
FIG. 6 is a cross sectional elevation view illustrating a step, which is subsequent to the step of FIG. 5, involved in a method of forming a first electronic component shown in FIGS. 1A and 1B along a 1A-1A line thereof.

As shown in FIG. 6, the seed layer 11 is selectively removed by using an Ar ion-milling using the conductive film 12 as a protective film, thereby forming a surface interconnection 102 on the substrate 10. The surface interconnection 102 is a stack of the seed layer 11 and the conductive film 12.

Figure 7:
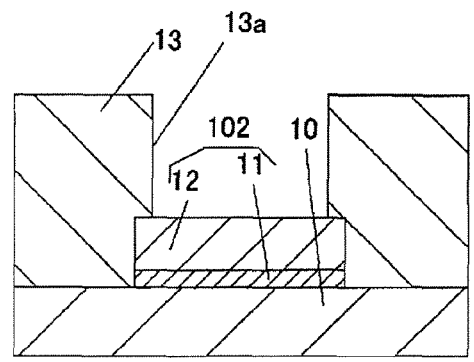
FIG. 7 is a cross sectional elevation view illustrating a step, which is subsequent to the step of FIG. 6, involved in a method of forming a first electronic component shown in FIGS. 1A and 1B along a 1A-1A line thereof.

As shown in FIG. 7, a first dummy film 13 is formed over the substrate 10. The first dummy film 13 has an opening 13$a$ which is positioned over the surface interconnection 102, so that the surface interconnection 102 is shown through the opening 13$a$. In some cases, the first dummy film 13 can be made of $SiO_2$. In this case, the first dummy film 13 of $SiO_2$ may be formed by a plasma enhanced chemical vapor deposition method. The opening 13$a$ can be formed by an anisotropic etching process such as a reactive ion etching process using a photo-resist mask. The thickness of the first dummy film 13 can be decided in accordance with the height of the connector 100 from the bonding surface 10$a$ of the substrate 10.

Figure 8:
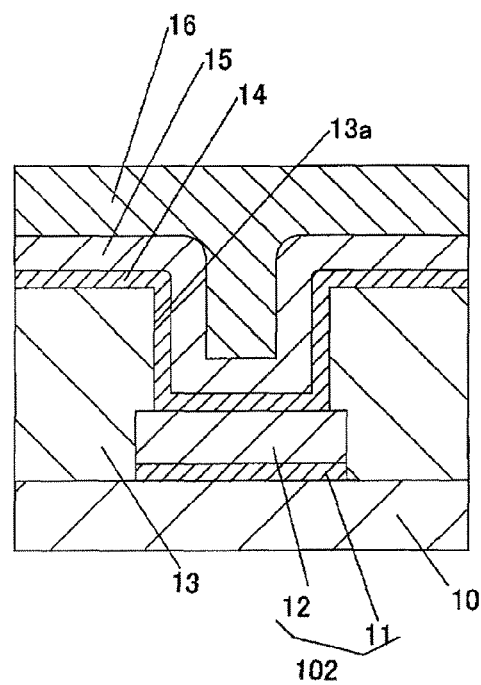
FIG. 8 is a cross sectional elevation view illustrating a step, which is subsequent to the step of FIG. 7, involved in a method of forming a first electronic component shown in FIGS. 1A and 1B along a 1A-1A line thereof.

As shown in FIG. 8, a seed layer 14 is formed on the upper surface of the first dummy film 13 and on the side wall of the opening 13$a$ as well as on the exposed surface of the surface interconnection 102. A conductive film 15 is formed on the seed layer 14 thereby forming a first conductive film which is a stack of the seed layer 14 and the conductive film 15. The opening 13$a$ is not filled up by the first conductive film. A second dummy film 16 is formed on the first conductive film so that the opening 13$a$ is filled up by the first and second conductive films. In some cases, the conductive film 15 may be made of W, while the seed layer 14 may be made of TiN. Other examples of the material for the conductive film 15 may include, but are not limited to, TaN, TiN, WSi, and Cu. The seed layer 14 may be made of other alloys. The seed layer 14 may be formed, by a sputtering process, on the surface of the surface interconnection 102 and on the surfaces of the first dummy film 13. The conductive film 15 may be formed by a chemical vapor deposition process on the seed layer 14. The second dummy film 16 may be made of, but not limited to, Cu, Sn, Zn, or Pb. In some cases, the second dummy film 16 may be formed by electrolytic plating, electroless plating, or pulse-plating.

Figure 9:
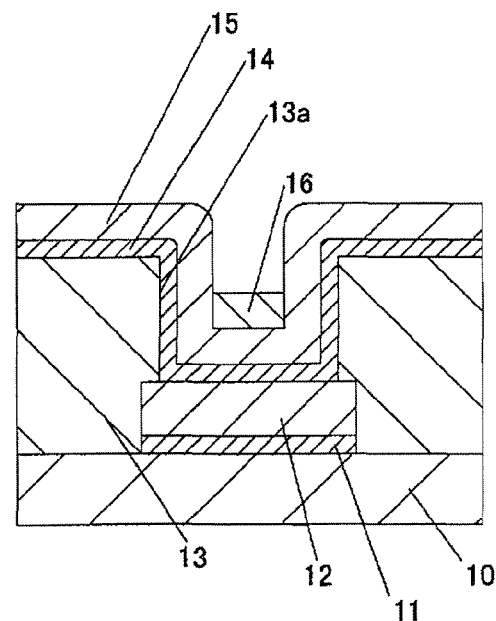
FIG. 9 is a cross sectional elevation view illustrating a step, which is subsequent to the step of FIG. 8, involved in a method of forming a first electronic component shown in FIGS. 1A and 1B along a 1A-1A line thereof.

As shown in FIG. 9, the second dummy film 16 can be selectively removed so that the second dummy film 16 resides at the bottom of the opening 13$a$ and on the conductive film 15. The second dummy film 16 can be selectively removed by an isotropic etching process. When the second dummy film 16 is made of Cu, a Cu-etchant is used to remove the second dummy film 16.

Figure 10:
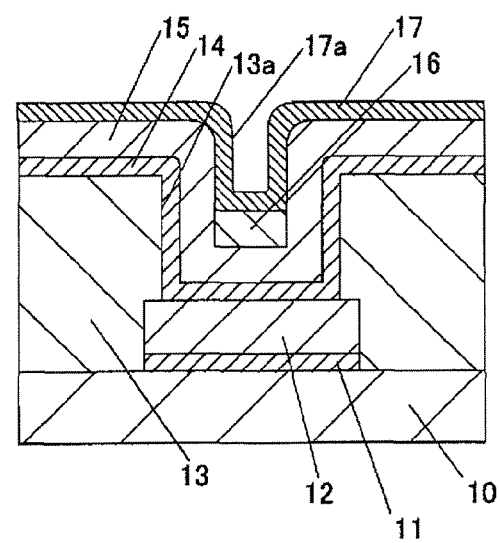
FIG. 10 is a cross sectional elevation view illustrating a step, which is subsequent to the step of FIG. 9, involved in a method of forming a first electronic component shown in FIGS. 1A and 1B along a 1A-1A line thereof.

As shown in FIG. 10, a second conductive film 17 is formed on the conductive film 15 and the second dummy film 16. The thickness of the second conductive film 17 is decided so that the opening 13$a$ is not filled up, but a hollow 17$a$ is formed over the second dummy film 16. In some cases, the second conductive film 17 may be made of, but not limited to, W, and a chemical vapor deposition process may be carried out to form the second conductive film 17. Other typical examples of the material for the second conductive film 17 may include, but are not limited to, nickel alloys such as NiFe, NiMo, NiW, NiMn, and NiP. Still other typical examples of the material for the second conductive film 17 may include, but are not limited to, TiN, TaN, WSi, Cu, Ni, and Cu alloys. The second conductive film 17 may be formed by, but not limited to, chemical vapor deposition, electrolytic plating, electroless plating, or pulse-plating.

Figure 11:
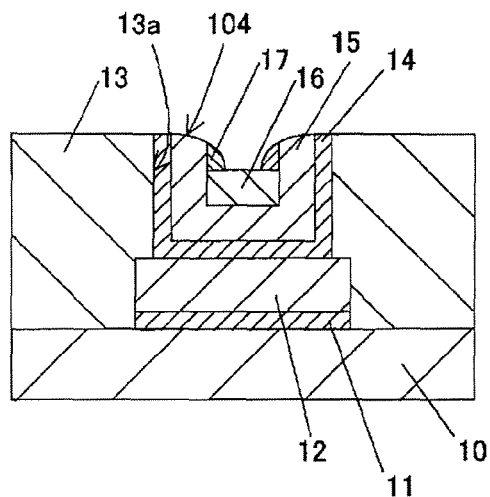
FIG. 11 is a cross sectional elevation view illustrating a step, which is subsequent to the step of FIG. 10, involved in a method of forming a first electronic component shown in FIGS. 1A and 1B along a 1A-1A line thereof.

As shown in FIG. 11, the second conductive film 17, the conductive film 15 and the seed layer 14 can be selectively removed by an anisotropic etching process. The anisotropic etching process can be terminated when outside the opening 13$a$ the first dummy film 13 is exposed, while inside the opening 13$a$ the second dummy film 16 is exposed and the second conductive film 17 resides on the side walls of the conductive film 15. The residual second conductive film 17 is in the form of side spacers. As a result, the etched edges of the residual second conductive film 17, the conductive film 15 and the seed layer 14 provide the guiding surfaces 104. The guiding surfaces 104 are convex as shown in FIG. 11. The anisotropic etching can be implemented by, but not limited to, a reactive etching using $SF_6$ reaction gas.

Figure 12:
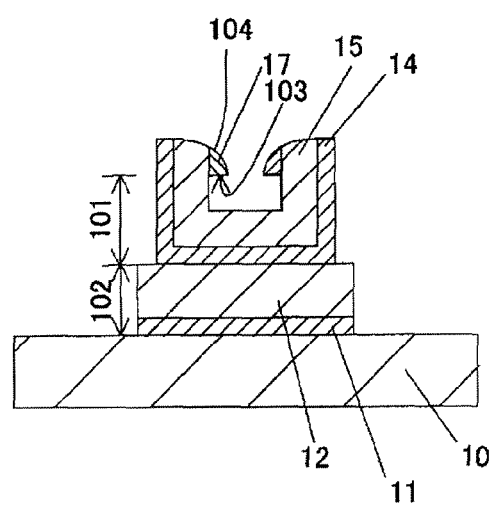
FIG. 12 is a cross sectional elevation view illustrating a step, which is subsequent to the step of FIG. 11, involved in a method of forming a first electronic component shown in FIGS. 1A and 1B along a 1A-1A line thereof.

As shown in FIG. 12, the first dummy film 13 and the second dummy film 16 are removed, thereby forming the connector 100 which includes the base 101 and the stoppers 17 with stopper surfaces 103. The base 101 may be a bottom-closed annular structure which projects from the surface interconnection 102. The annular structure has the fixed ends and the free ends, wherein the fixed end is fixed to the surface interconnection 102. The stoppers 17 with stopper surfaces 103 are fixed to the inside wall of the free ends of the base 101. In some cases, the second dummy film 16 of Cu may be removed by using Cu-etchant. In some cases, the first dummy film 13 of $SiO_2$ may be removed by using $CF_4$-etchant.

Figure 13A:
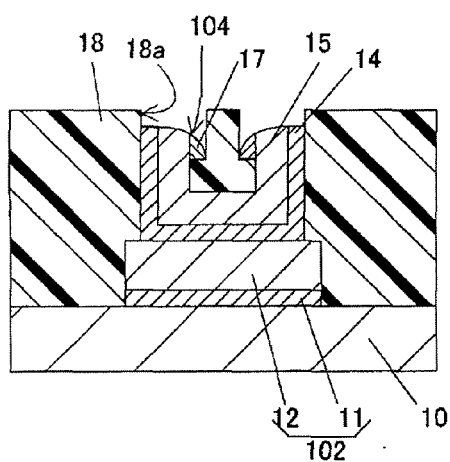
FIG. 13A is a cross sectional elevation view illustrating a step, which is subsequent to the step of FIG. 12, involved in a method of forming a first electronic component shown in FIGS. 1A and 1B along a 1A-1A line thereof.
Figure 13B:
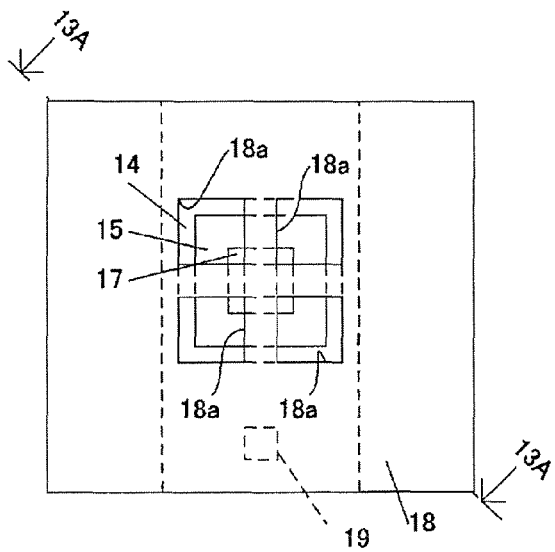
FIG. 13B is a plan view illustrating the step of FIG. 13A which illustrates it taken along an 13A-13A line of FIG. 13B.

As shown in FIGS. 13A and 13B, a photo-resist film 18 is formed over the substrate 10, so that the surface interconnection 102, the seed layer 14, the conductive film 15 and the stoppers 17 are buried in the photo-resist film 18. A photo-lithography is carried out to form an opening 18$a$ which has an annular shape. The seed layer 14, the conductive film 15 and the stoppers 17 are shown through the annular opening 18$a$ of the photo-resist film 18. In some cases, an alignment mark 19 may be formed in the process for etching the conductive film 12. This alignment mark 19 can also be used to accurately align the photo-resist film 18 with reference to the surface interconnection 102, for carrying out an exposure process. At least one opening 18$a$ needs to be formed for each connector. In some cases, the photo-resist film 18 may have plural openings 18a for each connector so that the annular shaped guiding surface 104 is uniformly divided by the plural openings 18a.

An anisotropic etching process is carried out using the photo-resist film 18 with the plural openings 18a, thereby making the annular-shaped structure of the base 101 with the stoppers 17 into slit structures of the base 101 with the stoppers 17. The slit structures of the base 101 with the stoppers 17 perform as elastic beams or elastic beams with the stoppers 17. The elastic beams or elastic beams with the stoppers 17 project from the bonding surface of the substrate 10 in the vertical direction. The anisotropic etching process can be carried out using $SF_6$ gas. The photo-resist film 18 is removed, thereby completing the connector 100 shown in FIGS. 1A and 1B.

The above-described process using the photo-lithography technique can be used to form a dense array of microconnectors 100 concurrently over the substrate 10

Sixth Embodiment

Method of Forming Electronic Components:

A method of forming the third electronic component 3 shown in FIGS. 2A and 2B will be described. FIGS. 14 through 17 are cross sectional elevation views illustrating a method of forming the third electronic component 3 shown in FIGS. 2A and 2B, taken along a 2A-2A line of FIG. 2B.

The same processes as those shown in FIGS. 5 through 7 are carried out, thereby obtaining the structure shown in FIG. 7.

Figure 14:
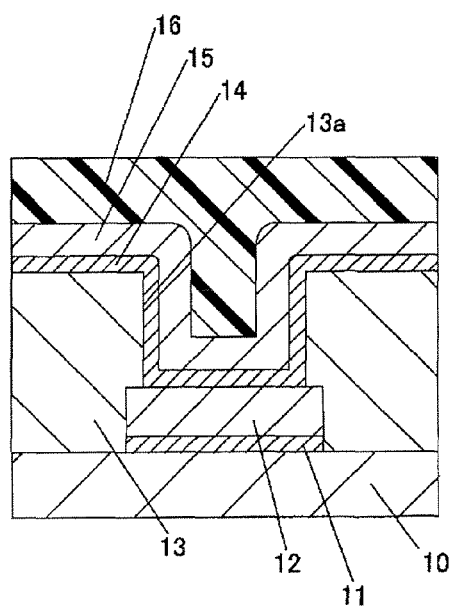
FIG. 14 is a cross sectional elevation view illustrating a step involved in a method of forming the third electronic component shown in FIGS. 2A and 2B, taken along a 2A-2A line of FIG. 2B.

As shown in FIG. 14, a seed layer 14 is formed on the upper surface of the first dummy film 13 and on the side wall of the opening 13a as well as on the exposed surface of the surface interconnection 102. A conductive film 15 is formed on the seed layer 14 thereby forming a first conductive film which is a stack of the seed layer 14 and the conductive film 15. The opening 13a is not filled up by the first conductive film. A second dummy insulating film 16 is formed on the first conductive film 15 so that the opening 13a is filled up by the first and second conductive films. In some cases, the conductive film 15 may be made of W, while the seed layer 14 may be made of TiN. Other examples of the material for the conductive film 15 may include, but are not limited to, TaN, TiN, WSi, and Cu. The seed layer 14 may be made of other alloys. The seed layer 14 may be formed, by a sputtering process, on the surface of the surface interconnection 102 and on the surfaces of the first dummy film 13. The conductive film 15 may be formed by a chemical vapor deposition process on the seed layer 14. The second dummy insulating film 16 may be made of an insulator such as photo-resist, $SiO_2$, or SiN. The second dummy insulating film 16 may be formed by known processes which may depend on the material of the second dummy insulating film 16.

Figure 15:
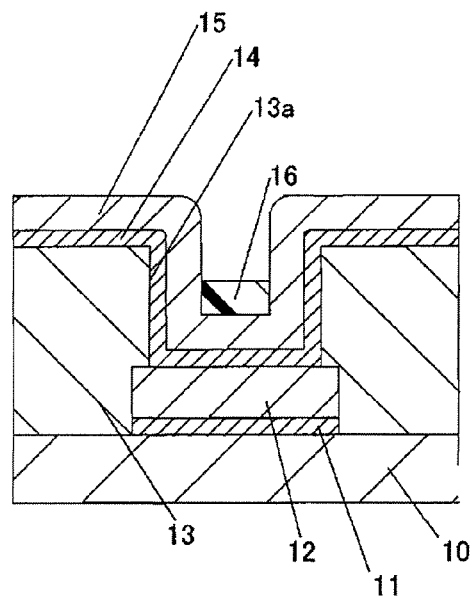
FIG. 15 is a cross sectional elevation view illustrating a step, which is subsequent to the step of FIG. 14, involved in a method of forming the third electronic component shown in FIGS. 2A and 2B, taken along a 2A-2A line of FIG. 2B.

As shown in FIG. 15, the second dummy insulating film 16 can be selectively removed so that the second dummy insulating film 16 resides at the bottom of the opening 13a and on the conductive film 15. The second dummy insulating film 16 can be selectively removed by an isotropic etching process.

Figure 16:
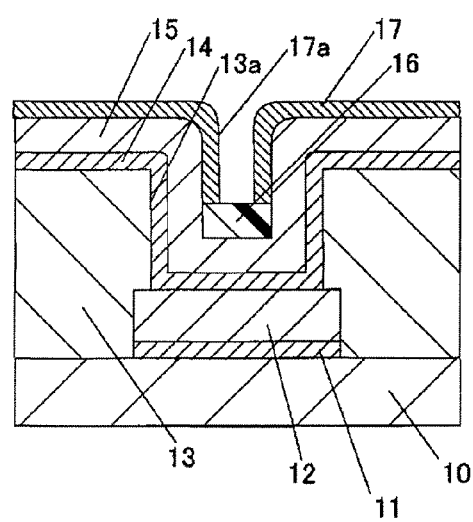
FIG. 16 is a cross sectional elevation view illustrating a step, which is subsequent to the step of FIG. 15, involved in a method of forming the third electronic component shown in FIGS. 2A and 2B, taken along a 2A-2A line of FIG. 2B.

As shown in FIG. 16, a second conductive film 17 is formed on the conductive film 15, but not on the residual second dummy insulating film 16. Since the second dummy insulating film 16 is made of an insulator, no deposition is caused of the second conductive film 17 on the residual second dummy insulating film 16. The thickness of the second conductive film 17 is decided so that the opening 13a is not filled up, but a hollow 17a is formed over the second dummy insulating film 16. In some cases, the second conductive film 17 may be made of, but not limited to, W, and a chemical vapor deposition process may be carried out to form the second conductive film 17. Other typical examples of the material for the second conductive film 17 may include, but are not limited to, nickel alloys such as NiFe, NiMo, NiW, NiMn, and NiP. Still other typical examples of the material for the second conductive film 17 may include, but are not limited to, TiN, TaN, WSi, Cu, Ni, and Cu alloys. The second conductive film 17 may be formed by, but not limited to, chemical vapor deposition, electrolytic plating, electroless plating, or pulse-plating.

Figure 17:
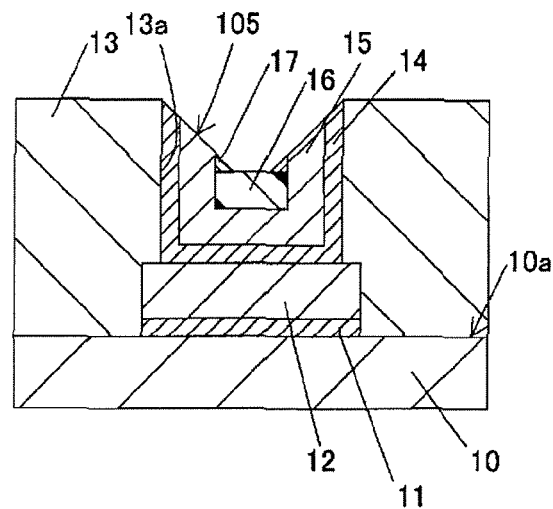
FIG. 17 is a cross sectional elevation view illustrating a step, which is subsequent to the step of FIG. 16, involved in a method of forming the third electronic component shown in FIGS. 2A and 2B, taken along a 2A-2A line of FIG. 2B.

As shown in FIG. 17, the second conductive film 17, the conductive film 15 and the seed layer 14 can be selectively removed by an ion-milling process. In the ion-milling process, Ar-ions are irradiated onto the second conductive film 17 in the direction vertical to the bonding surface 10a of the substrate 10, whereby the second conductive film 17, the conductive film 15 and the seed layer 14 can be selectively removed, thereby forming guiding surfaces 105. The guiding surfaces 105 may typically be sloped planes and non-curved surfaces, wherein the sloped planes have an angle of about 45 degrees.

The same processes as those shown in FIGS. 12 and 13A-13B are carried out, thereby completing the connector 110 shown in FIGS. 2A and 2B.

The above-described process using the photo-lithography technique can be used to form a dense array of microconnectors 110 concurrently over the substrate 10

Seventh Embodiment

Method of Forming Electronic Components:

A method of forming the fourth electronic component 4 shown in FIGS. 3A and 3B will be described. FIGS. 18 through 21 are cross sectional elevation views illustrating a method of forming the fourth electronic component 4 shown in FIGS. 3A and 3B, taken along a 3A-3A line of FIG. 3B.

The same processes as those shown in FIGS. 5 through 8 are carried out, thereby obtaining the structure shown in FIG. 8.

Figure 18:
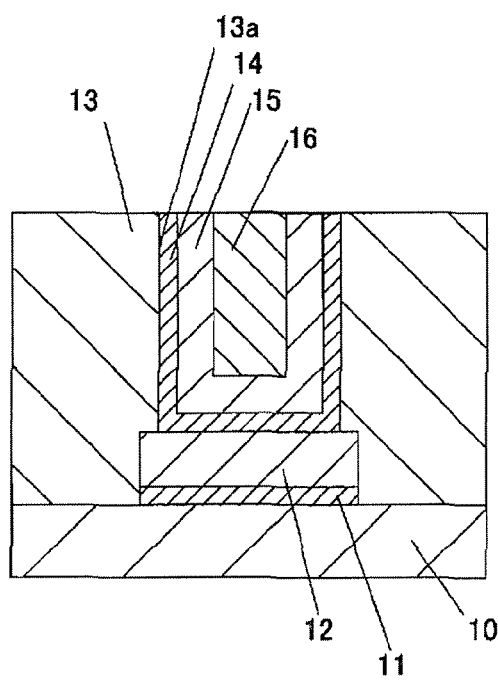
FIG. 18 is a cross sectional elevation view illustrating a step involved in a method of forming the fourth electronic component shown in FIGS. 3A and 3B, taken along a 3A-3A line of FIG. 3B.

As shown in FIG. 18, the conductive film 15, the seed layer 14 and the second dummy film 16 may be selectively removed so that the first dummy film 13 is exposed, while the conductive film 15, the seed layer 14 and the second dummy film 16 reside within the opening 13a of the first dummy film 13. The process for selective removal may be implemented by, but is not limited to, grinding or polishing. A typical example of the polishing process may be, but is not limited to, a chemical mechanical polishing. The process for selective removal may be terminated when the first dummy film 13 is exposed, while the conductive film 15, the seed layer 14 and the second dummy film 16 reside within the opening 13a of the first dummy film 13. The process for selective removal can form a planarized surface which is present over the first dummy film 13, the seed layer 14, the conductive film 15 and the second dummy film 16.

Figure 19:
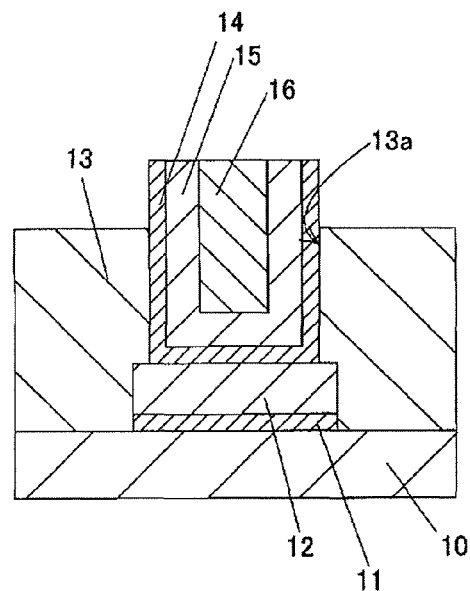
FIG. 19 is a cross sectional elevation view illustrating a step, which is subsequent to the step of FIG. 18, involved in a method of forming the fourth electronic component shown in FIGS. 3A and 3B, taken along a 3A-3A line of FIG. 3B.

As shown in FIG. 19, the first dummy film 13 is selectively removed so that upper portions of the conductive film 15, the seed layer 14 and the second dummy film 16 project from the first dummy film 13. The process for selective removal of the first dummy film 13 can be implemented by an anisotropic etching process.

Figure 20:
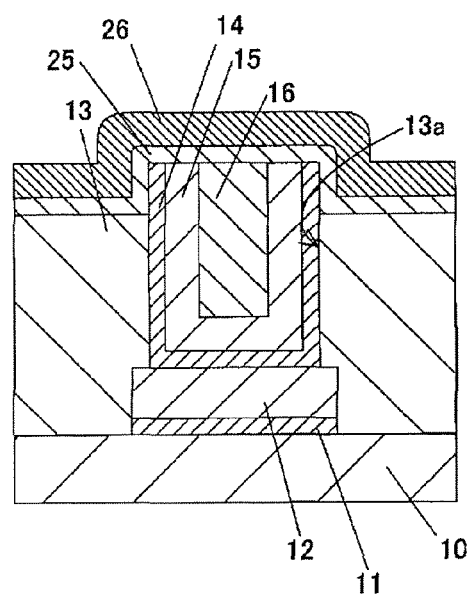
FIG. 20 is a cross sectional elevation view illustrating a step, which is subsequent to the step of FIG. 19, involved in a method of forming the fourth electronic component shown in FIGS. 3A and 3B, taken along a 3A-3A line of FIG. 3B.

As shown in FIG. 20, a seed layer 25 is formed on the surfaces of the first dummy film 13, the seed layer 14, the conductive film 15, and the second dummy film 16. A conductive film 26 is formed on the seed layer 25, thereby forming a second conductive film which is a stack of the seed layer 25 and the conductive film 26. In some cases, the seed layer 25 may be made of, but not limited to, TiN, and the conductive film 26 may be made of, but not limited to, W. In this case, the conductive film 26 of W may be formed by a chemical vapor deposition. In other cases, the seed layer 25 may be made of other alloys than TiN. In other cases, the conductive film 26 may be made of other refractory metals such as TiN and TaN. The process for forming the conductive film 26 may include, but is not limited to, the chemical vapor deposition, the electrolytic plating, the electroless plating, pulse-plating, evaporation or deposition.

Figure 21:
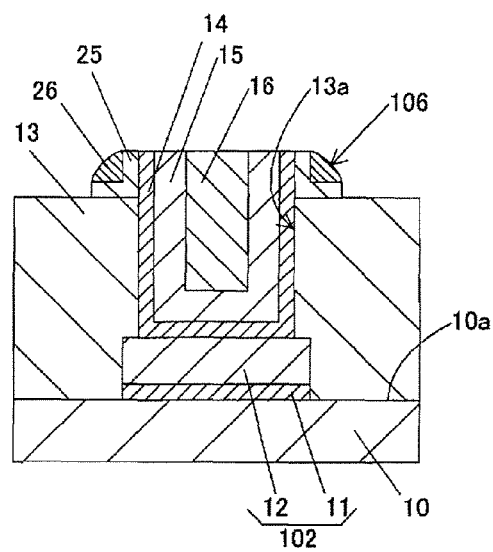
FIG. 21 is a cross sectional elevation view illustrating a step, which is subsequent to the step of FIG. 20, involved in a method of forming the fourth electronic component shown in FIGS. 3A and 3B, taken along a 3A-3A line of FIG. 3B.

As shown in FIG. 21, the stack of the conductive film 26 and the seed layer 25 is selectively removed so that the stack of the conductive film 26 and the seed layer 25 resides the side walls of the projecting structure which includes the seed layer 14, the conductive film 15, and the second dummy film 16. The residual stacks of the conductive film 26 and the seed layer 25 perform as the stoppers 25, 26. The surfaces of the residual stack of the conductive film 26 and the seed layer 25 form the guiding surfaces 106 that are sloped down outwardly. The guiding surfaces 106 curve outward in the middle. The guiding surfaces 106 may curve convexly. The downward direction is defined to be a direction from the free ends of the beams toward the bonding surface 10a of the substrate 10, wherein the direction is vertical to the bonding surface 10a of the substrate 10. In typical cases, a first dimension of the residual stack of the conductive film 26 and the seed layer 25 from the seed layer 14 can be defined in the direction that is perpendicular to the vertical side wall of the seed layer. The first dimension of the residual stack of the conductive film 26 and the seed layer 25 decreases as the position comes distanced from the bonding surface 10a of the substrate 10.

The same processes as those shown in FIGS. 12 and 13A-14B are carried out, thereby obtaining the connector 120 shown in FIGS. 3A and 3B.

The above-described process using the photo-lithography technique can be used to form a dense array of microconnectors 120 concurrently over the substrate 10

Eighth Embodiment

Method of Forming Electronic Components:

A method of forming the sixth electronic component 6 shown in FIGS. 4A and 4B will be described. FIGS. 22A, 23A, 24, 25, and 26 are cross sectional elevation views illustrating a method of forming the sixth electronic component 6 shown in FIGS. 4A and 4B, taken along a 4A-4A line of FIG. 4B. FIGS. 22B and 23B are plan views illustrating the sixth electronic components 6 shown in FIGS. 22A and 23A.

The same processes as those shown in FIGS. 5 through 7 are carried out, thereby obtaining the structure shown in FIG. 7.

Figure 22A:
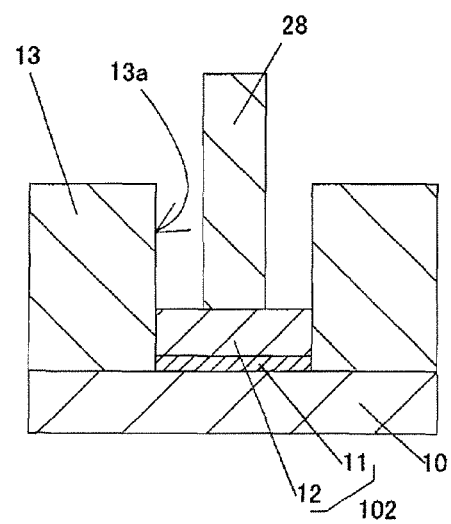
FIG. 22A is a cross sectional elevation view illustrating a step involved in a method of forming the sixth electronic component shown in FIGS. 4A and 4B, taken along a 4A-4A line of FIG. 4B.
Figure 22B:
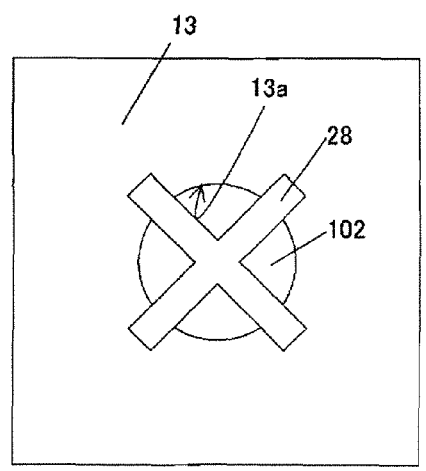
FIG. 22B is a plan view illustrating the sixth electronic components shown in FIGS. 22A.

As shown in FIGS. 22A and 22B, a dummy separating film 28 is formed on the surface interconnection 102 and on the first dummy film 13 so that the dummy separating film 28 separates the opening 13a into a plurality of sections. In some cases, the dummy separating film 28 may have a cross-shaped vertical wall structure which separates the opening 13a into four divided sections as shown in FIG. 22B. In some cases, the dummy separating film 28 may be made of $SiN_x$. In other cases, the dummy separating film 28 may be made of the same material, $SiO_2$, as the first dummy film 13. The dummy separating film 28 may be deposited over the surface interconnection 102 and the first dummy film 13 by a chemical vapor deposition. The dummy separating film 28 may be selectively removed to as to form the cross-shaped vertical wall structure. The process for selective removal of the dummy separating film 28 can be implemented by, but not limited to, a reactive ion etching process using a photo-resist mask.

Figure 23A:
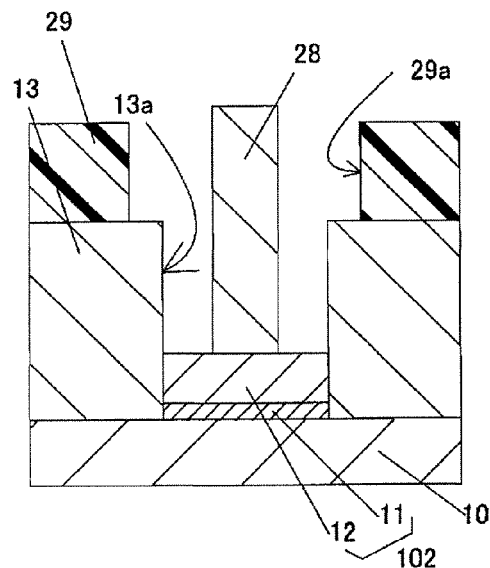
FIG. 23A is a cross sectional elevation view illustrating a step, which is subsequent to the step of FIGS. 22A and 22B, involved in a method of forming the sixth electronic component shown in FIGS. 4A and 4B, taken along a 4A-4A line of FIG. 4B.
Figure 23B:
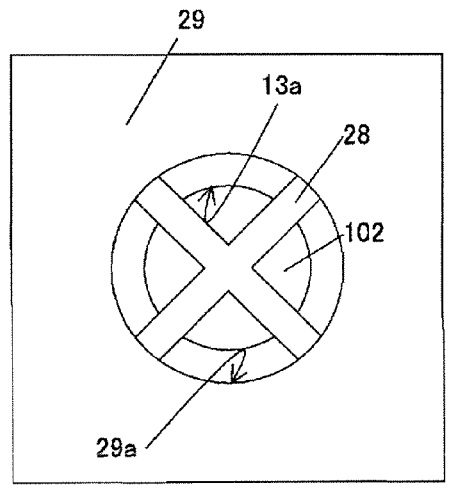
FIG. 23B is a plan view illustrating the sixth electronic components shown in FIGS. 23A.

As shown in FIGS. 23A and 23B, a dummy film 29 having an opening 29a is formed on the first dummy film 13. The opening 29a of the dummy film 29 encompasses the opening 13a of the first dummy film 13, so that the opening 13a and its periphery of the first dummy film 13 is shown in the opening 29a. The dummy separating film 28 not only separates the opening 13a into the four divided sections but also separates the opening 29a into different four divided sections. Each of the four divided sections of the opening 13a is defined by the opening 13a of the first dummy film 13 in combination with the dummy separating film 28. Each of the four divided sections of the opening 29a is defined by the opening 29a of the dummy film 29 in combination with the dummy separating film 28. The first dummy film 13 in combination with the dummy separating film 28 defines the four divided sections of the opening 13a. The dummy film 29 in combination with the dummy separating film 28 defines the four divided sections of the opening 29a.

In some cases, the dummy film 29 may be made of a photo-resist. The opening 29a can be formed by carrying out exposure and development processes for the photo-resist.

Figure 24:
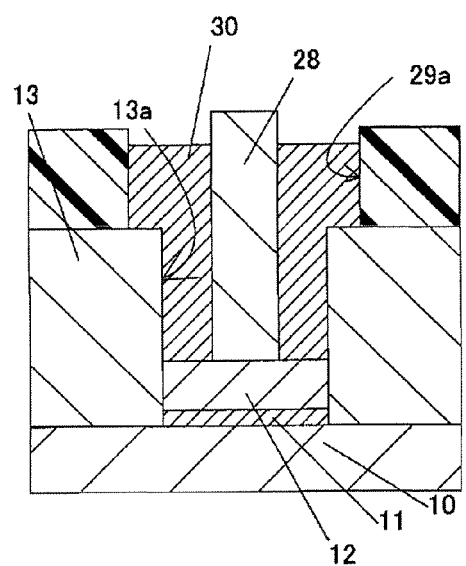
FIG. 24 is a cross sectional elevation view illustrating a step, which is subsequent to the step of FIGS. 23A and 23B, involved in a method of forming the sixth electronic component shown in FIGS. 4A and 4B, taken along a 4A-4A line of FIG. 4B.

As shown in FIG. 24, conductive films 30 are formed within the openings 13a and 29a so that the conductive films 30 fill up the four divided sections of the opening 13a and fill partially the four divided sections of the opening 29a. The conductive films 30 are deposited on the surface interconnection 102 and the exposed upper surface of the first dummy film 13. In some cases, the conductive films 30 may be made of, but not limited to, Ni. The conductive films 30 may be formed by electrolytic plating. Other examples of materials for the conductive film 30 may include, but are not limited to, Ni-alloys such as NiFe, NiMo, NiW, NiMn, NiP, Cu or Cu-alloys. The process for forming the conductive films 30 may be implemented by, but not limited to, electrolytic plating, electroless plating, or pulse-plating.

Figure 25:
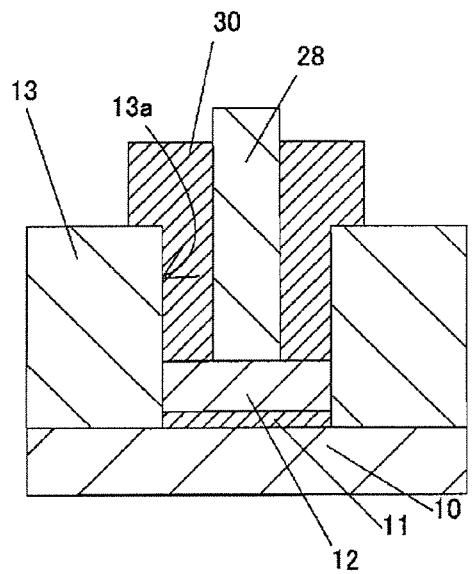
FIG. 25 is a cross sectional elevation view illustrating a step, which is subsequent to the step of FIG. 24, involved in a method of forming the sixth electronic component shown in FIGS. 4A and 4B, taken along a 4A-4A line of FIG. 4B.

As shown in FIG. 25, the dummy film 29 is removed so that the upper portions of the conductive films 30 project from the first dummy film 13.

Figure 26:
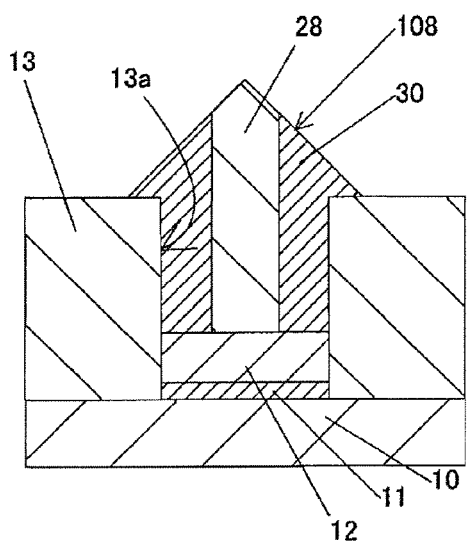
FIG. 26 is a cross sectional elevation view illustrating a step, which is subsequent to the step of FIG. 25, involved in a method of forming the sixth electronic component shown in FIGS. 4A and 4B, taken along a 4A-4A line of FIG. 4B.

As shown in FIG. 26, the projecting combination of the upper portions of the conductive films 30 and the upper portion of the dummy separating film 28 is selectively removed and tapered, thereby forming the guiding surfaces 108 which are sloped down outwardly. The downward direction is defined to be a direction from the free ends of the beams toward the bonding surface 10a of the substrate 10, wherein the direction is vertical to the bonding surface 10a of the substrate 10. In some cases, the guiding surfaces 108 may be sloped planes and non-curved surfaces. In particular cases, the sloped planes may have an angle of about 45 degrees. The process for selective removal or tapering may be implemented by, but not limited to, an ion-milling process such as an Ar-ion milling process.

The dummy film 28 and the first dummy film 13 are removed. The same processes as those shown in FIG. 13 are carried out, thereby obtaining the connector 130 shown in FIGS. 4A and 4B.

Modifications

In the foregoing embodiments, the projecting electrode 201 of the second electronic component 2 shown in FIGS. 1A, 1B, 2A and 2B may be modified in shape so as to allow the head portion of the projecting electrode 201 to be snap-fitted into the connector 100 or 110. The shape of the head portion of the projecting electrode 201 may be modified to, but not limited to, an arrowhead.

It is possible as a modification that the dummy films 28 and 29 are made of the same material, and the dummy film 29 is removed, while the dummy film 28 is covered by the mask, before the dummy film 28 is then removed. It is also possible as a further modification that the dummy films 28 and 29 are concurrently removed.

It is possible that the base 101 of the connector 100, 110, 120, or 130 may be implemented by, but not limited to, a single unit of hollow beam, or a plurality of units of beams or beams that are divided by a slit or slits.

It is further possible to modify each element of the connector 100, 110, 120, or 130 in materials, dimensions, and shapes thereof, as long as modifications are obvious to a person having ordinary skill in the art to which the invention pertains. It is furthermore possible to modify processes for forming each film or layer and processes for patterning the film or layer, as long as modifications are obvious to a person having ordinary skill in the art to which the invention pertains. It is furthermore possible to modify a series of processes for forming the structure of the connector, as long as modifications are obvious to a person having ordinary skill in the art to which the invention pertains.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electronic component comprising:
    a substrate;
    an interconnection element having conductivity, the interconnection element being over the substrate; and
    a connector on the interconnection element, the connector further comprising:
        a base that projects from the interconnection element in a first direction that is vertical to the surface of the substrate,
        at least one stopper that projects from the base in a second direction that is parallel to the surface of the substrate, the one stopper having a stopper surface, and
        at least one sloped guiding surface,
    wherein the connector is snap-fitted with at least a portion of an external electrode, and the stopper is configured to hold the external electrode.

2. The electronic component according to claim 1, wherein the at least one sloped guiding surface is sloped down inwardly, and the stopper projects inwardly.

3. The electronic component according to claim 1, wherein the at least one sloped guiding surface is sloped down outwardly, and the stopper projects outwardly.

4. The electronic component according to claim 1, wherein the base has a free end and a fixed end that is fixed to the interconnection element, and the at least one stopper projects from the free end.

5. The electronic component according to claim 1, wherein the base comprises a plurality of beams which project from the interconnection element in the vertical direction.

6. An electronic component comprising:
    a substrate;
    an interconnection element having conductivity, the interconnection element being over the substrate; and
    a connector on the interconnection element, the connector further comprising:
        a base that projects from the interconnection element in a first direction that is vertical to the surface of the substrate,
        at least one stopper that projects from the base in a second direction that is parallel to the surface of the substrate, the one stopper having a stopper surface, and
        at least one sloped guiding surface,
    wherein the base comprises a hollow beam which projects from the interconnection element in the vertical direction.

7. An electronic component comprising:
    a substrate;
    an interconnection element having conductivity, the interconnection element being over the substrate; and
    a connector on the interconnection element, the connector further comprising:
        a base that projects from the interconnection element in a first direction that is vertical to the surface of the substrate,
        at least one stopper that projects from the base in a second direction that is parallel to the surface of the substrate, the one stopper having a stopper surface, and
        at least one sloped guiding surface,
    wherein the base is elastic and deformable.

8. An electronic component comprising:
    a substrate;
    an interconnection element having conductivity, the interconnection element being over the substrate; and
    a connector on the interconnection element, the connector further comprising:
        a base that projects from the interconnection element in a first direction that is vertical to the surface of the substrate,
        at least one stopper that projects from the base in a second direction that is parallel to the surface of the substrate, the one stopper having a stopper surface, and
        at least one sloped guiding surface,
    wherein the base is electrically conductive.

* * * * *